United States Patent
McMahon (10) Patent No.: US 11,810,785 B2
(45) Date of Patent: Nov. 7, 2023

(54) THIN FILM CRYSTALLIZATION PROCESS

(71) Applicant: LUX SEMICONDUCTORS, INC., Albany, NY (US)

(72) Inventor: Shane Thomas McMahon, Saratoga Springs, NY (US)

(73) Assignee: LUX SEMICONDUCTORS, Albany, NY (US)

( * ) Notice: Subject to any disclaimer, the term of this patent is extended or adjusted under 35 U.S.C. 154(b) by 524 days.

(21) Appl. No.: 16/707,896

(22) PCT Filed: May 10, 2018

(86) PCT No.: PCT/US2018/032070
§ 371 (c)(1),
(2) Date: Dec. 9, 2019

(87) PCT Pub. No.: WO2018/209088
PCT Pub. Date: Nov. 15, 2018

(65) Prior Publication Data
US 2020/0328081 A1 Oct. 15, 2020

Related U.S. Application Data (60) Provisional application No. 62/504,288, filed on May 10, 2017.

(51) Int. Cl.
*H01L 21/02* (2006.01)
*C30B 1/02* (2006.01)
(Continued)

(52) U.S. Cl.
CPC ........ *H01L 21/02667* (2013.01); *C30B 1/023* (2013.01); *C30B 1/08* (2013.01);
(Continued)

(58) Field of Classification Search
CPC ......... H01L 21/02667; H01L 21/02425; H01L 21/02491; H01L 21/02521
See application file for complete search history.

(56) References Cited

U.S. PATENT DOCUMENTS 5,273,911 A 12/1993 Sasaki et al.
5,587,014 A 12/1996 Iyechika et al.
(Continued)

FOREIGN PATENT DOCUMENTS

JP S5893215 A 6/1983
JP S58151393 A 9/1983
(Continued)

OTHER PUBLICATIONS

"Rapid synthesis of carbon nanotubes via inductive heating", Brian D. Sosnowchik and Liwei Lin, Applied Physics Letters 89, 193112 (2006) (3 pp.).
(Continued)

*Primary Examiner* — David Vu
(74) *Attorney, Agent, or Firm* — Patrick Stanzione; Stanzione & Associates, PLLC (57) ABSTRACT

A method of performing regional heating of a substrate by electromagnetic induction heating. The method may include applying a semiconductor film to the substrate and controllably energizing a coil positioned near the substrate. The energized coil(s) thereby generates a magnetic flux, which induces a current in the substrate and/or the semiconductor film, thereby heating the substrate and/or semiconductor film. The method may also include relative motion between the coil and the substrate to provide translation heating of the semiconductor film. Additionally, a crystal seeding mechanism may be employed to further control the crystallization process.

19 Claims, 8 Drawing Sheets

(51) Int. Cl.
  *C30B 1/08* (2006.01)
  *C30B 33/02* (2006.01)
(52) U.S. Cl.
  CPC ........ *C30B 33/02* (2013.01); *H01L 21/02425* (2013.01); *H01L 21/02491* (2013.01)

(56) References Cited

U.S. PATENT DOCUMENTS

| | | | |
|---|---|---|---|
| 5,970,368 | A | 10/1999 | Sasaki et al. |
| 6,423,949 | B1 | 7/2002 | Chen et al. |
| 6,653,212 | B1 | 11/2003 | Yamanaka et al. |
| 6,747,254 | B2 | 6/2004 | Kim et al. |
| 6,878,909 | B2 * | 4/2005 | Bergstrom ............ H01L 21/324 219/635 |
| 7,989,736 | B2 | 8/2011 | Park et al. |
| 8,030,190 | B2 | 10/2011 | Lee |
| 8,440,270 | B2 | 5/2013 | Morisaki et al. |
| 9,416,439 | B2 | 8/2016 | Sin et al. |
| 9,988,740 | B1 * | 6/2018 | Levine .................... C30B 29/52 |
| 2003/0164371 | A1 | 9/2003 | Bergstrom et al. |
| 2004/0157382 | A1 * | 8/2004 | Tsao .................... H01L 21/2026 438/151 |
| 2005/0117315 | A1 | 6/2005 | Weekamp |
| 2005/0186723 | A1 | 8/2005 | Kim |
| 2006/0286780 | A1 | 12/2006 | Jang et al. |
| 2007/0026647 | A1 | 2/2007 | Chang et al. |
| 2007/0164293 | A1 | 7/2007 | Hamano et al. |
| 2008/0251798 | A1 | 10/2008 | Ogihara et al. |
| 2010/0330785 | A1 | 12/2010 | Lee |
| 2011/0095331 | A1 * | 4/2011 | Hanawa ................. H01L 33/16 438/46 |
| 2013/0206468 | A1 | 8/2013 | Rathburn |
| 2015/0295127 | A1 | 10/2015 | Shur et al. |
| 2018/0151485 | A1 | 5/2018 | Kao et al. |
| 2019/0148301 | A1 | 5/2019 | Huang et al. |

FOREIGN PATENT DOCUMENTS

| | | |
|---|---|---|
| JP | S632312 A | 1/1988 |
| JP | 2003007638 A | 1/2003 |
| JP | 2003059831 A | 2/2003 |
| JP | 2007067431 A | 3/2007 |
| JP | 2008066577 A | 3/2008 |
| JP | 2010003768 A | 1/2010 |
| JP | 2010534412 A | 11/2010 |
| JP | 2011158579 A | 8/2011 |
| KR | 20100092420 A | 8/2010 |
| WO | 2012132077 A1 | 10/2012 |
| WO | 2013189873 A1 | 12/2013 |
| WO | 2015070589 A1 | 5/2015 |

OTHER PUBLICATIONS

"Graphene Synthesis via Magnetic Inductive Heating of Copper Substrates", Richard Piner, et al., ACSNANO, vol. 7, No. 9, 2013, (pp. 7495-7499).
PCT International Search Report dated Jul. 13, 2018 for PCT/US2018/032070 filed May 10, 2018.
Wu et al., "Electromagnetic Induction Heating for Single Crystal Graphene Growth: Morphology Control by Rapid Heating and Quenching", Scientific Reports, 5-9034; DOI: 10.1038 / pp. 1-7 Mar. 12, 2015.
Supplementary European Search Report dated Jan. 12, 2021.
International Search Report and Written Opinion dated Jan. 11, 2021.
Japanese First Office Action dated Jun. 2, 2022, 6 pp.
Korean Office Action (w/English translation) (dated Jul. 14, 2022, 7 pp.

* cited by examiner

*Flexible Semiconductor Substrates (\*Feasible)*

| Semiconductor | Mobility cm²/(V·s) | Cost | Area | Temp | CMOS |
|---|---|---|---|---|---|
| Metal Oxides | 10-100 | Low | Large | Med | No |
| Organics | 0.1-10 | Low | Large | Low | No |
| Amorphous Si | 1 | Low | Large | Low | Yes |
| Laser Poly Si | ~100 | High | Small | High | Yes |
| Lux Si & Ge | **800\* & 1,400\* | Low | Large | High | Yes** |

*FIG. 7*

FIG. 8 ically, and biometric systems. The key differentiator of flexible electronics over conventional electronics, as the name implies, is that they can be made flexible, allowing for lightweight, conformal designs for new and useful innovations not possible with rigid wafer or glass-based electronics. The nature of flexibility also lends itself to enhanced durability, and in most cases reduced thickness. The overall impact and promise of flexible electronics on society is therefore both positive and significant, as they enable more customizable, form fitting, durable, unobtrusive, lighter weight, and cost-effective designs. Moreover, flexible substrates that allow for large area and high throughput manufacturing provide promising pathways to significantly reduce per unit costs of these smart devices.
THIN FILM CRYSTALLIZATION PROCESS

CROSS-REFERENCE TO RELATED APPLICATIONS

This application claims priority to PCT Application No. US2018/032070 filed May 10, 2018 and U.S. Provisional Application No. 62/504,288, filed May 10, 2017, the entire disclosures of which are incorporated herein by reference.

BACKGROUND OF THE INVENTION

Technical Field

The present invention relates, generally, to systems and methods for producing a crystalline semiconductor thin film, and more specifically to systems and methods for increasing the crystallinity of thin films.

Background

Figure 7:
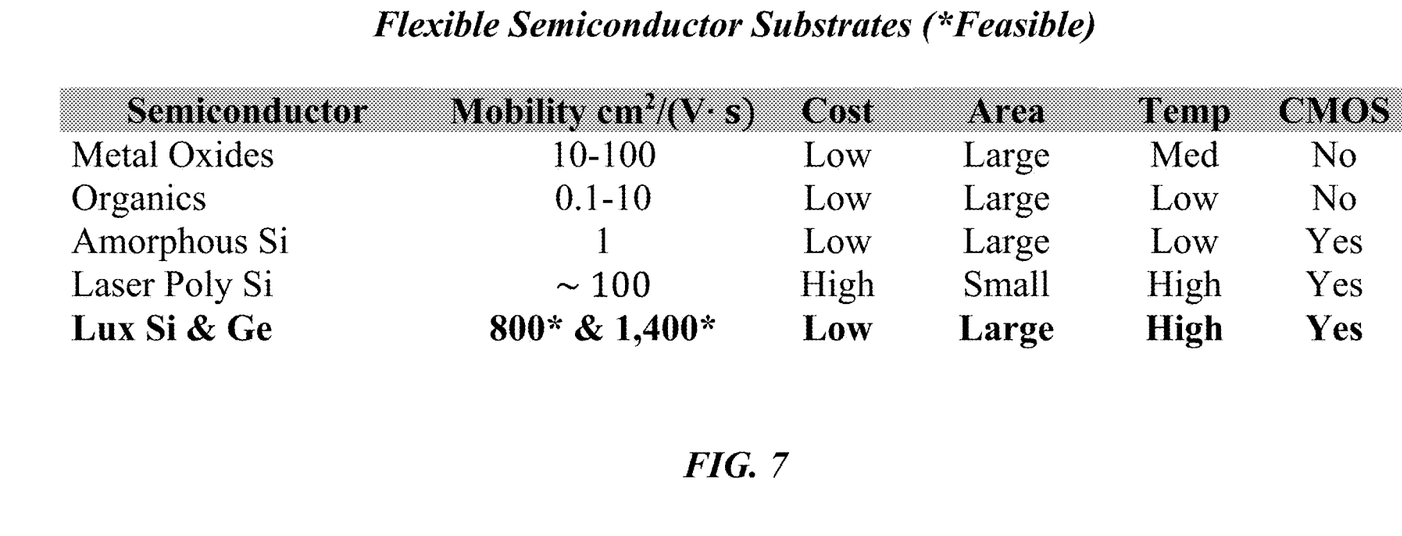
FIG. 7 is a table of possible flexible semiconductor substrates with properties thereof.

Flexible electronics have wide impacting applications in many modern technologies, including displays (OLED based, for example), solar photovoltaics (PV), wearables, sensors, energy storage, energy harvesting, micro-electromechanical systems (MEMS), thin-film transistors (TFT), thin-film diodes (TFD), thin-film nanostructures, biomedi- Designers and manufacturers of electronic products currently do not have a low cost, high performing option when choosing a flexible semiconductor substrate for their devices. Low cost options typically consist of an active semiconductor layer of low mobility amorphous silicon or solution processed organic, paired with a flexible substrate such as flexible polymer. The key issue facing these material choices, however, is that the electrical performance is significantly lower than that available from conventional monocrystalline silicon wafers. For example, the use of polymer substrates creates a large challenge, as nearly all standard processes need to be reengineered for low temperature. FIG. 7 depicts a comparison of available substrate materials and their corresponding drawbacks. Methods exist for producing flexible thin film polycrystalline silicon layers that can achieve more reasonable performance, but the processes involved to create these materials are typically expensive and low throughput. These methods include either slow, localized recrystallization process, or using sacrificial layers on wafers that are then selectively etched to release a transferable crystalline film. Currently, there is no cost-effective flexible electronics substrate that can be made in large areas, is high quality, is high temperature compatible, and is suitable for roll-to-roll manufacturing.

Thus, a need exists for producing flexible thin film polycrystalline silicon layers at a low cost and high performance.

SUMMARY OF THE INVENTION

The present invention provides, in an aspect, a method for forming a crystalline semiconductor film, which includes applying a first semiconductor thin film onto a supporting electrically conductive substrate. A coil is controllably energized and positioned near the electrically conductive substrate with the energizing resulting in a magnetic flux. A current is induced in the electrically conductive substrate thereby locally heating the substrate via joule heating. Heat is conducted from the substrate to the semiconductor film to change a property of the semiconductor film.

The present invention provides, in an aspect a method for forming a crystalline semiconductor film, which includes applying a first semiconductor thin film onto a mechanically supporting electrically conductive substrate. A coil is controllably energized and positioned near the electrically conductive substrate with the energizing resulting in a magnetic flux. A current is induced in an electrically conductive susceptor thereby locally heating the susceptor via joule heating. Heat is conducted to the mechanically supporting substrate of which the susceptor is in physical contact with. The substrate heat is conducted to the semiconductor film to change a property of the semiconductor film.

DETAILED DESCRIPTION OF THE INVENTION

In accordance with the principles of the present invention, systems and methods for producing a thin film of semiconductor material are provided.

A semiconductor film may be an amorphous, nanocrystalline, polycrystalline or combination thereof thin film of semiconductor material. Heating may induce crystallization of the deposited film. The crystallization process may be performed by a high temperature anneal such that crystallization of the semiconductor occurs in the solid state. In another example, such crystallization may be done by a high temperature anneal such that crystallization of the semiconductor occurs during precipitation from the liquid state.

Furthermore, both crystallization approaches can employ a scanning anneal which can be achieved by controlling a relative motion between the substrate and an induction coil.

Figure 1:
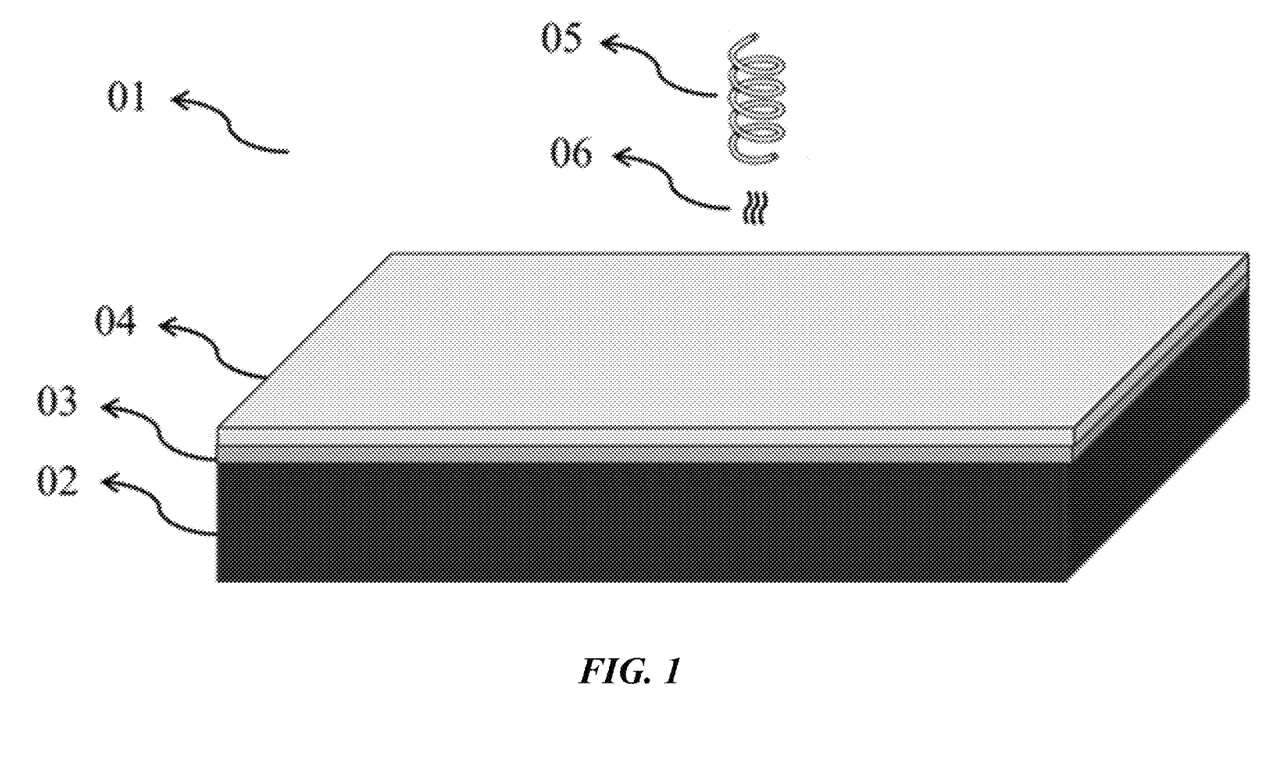
FIG. 1 is a perspective view of a semiconductor film on a substrate and an induction coil used to heat the substrate in accordance with the present invention.

The invention may utilize induction heating and subsequent heat transfer to heat a semiconductor film. Induction heating may be used for heat generation due to its ability to provide local temperature control of a specific region of a material or substrate. This contrasts with ambient heating mechanisms that heat volumetric spaces, such as radiant heat lamps, which heat the target material via radiation and convection. In the context of the present invention, the capability to selectively heat specified regions of a material or substrate allows for the controlled propagation of crystal growth, which is not feasible using aforementioned non-localized ambient heating mechanisms. FIG. 1 depicts a typical induction heating system.

In an example illustrated in FIG. 1, a semiconductor film 04 is deposited either directly onto an inductively active substrate 02 or onto interlayers 03, which themselves are deposited onto an inductively active substrate 02, whereby an induction coil 05 is used to generate an alternating magnetic field 06 that couples to inductively active substrate 02.

Figure 5:
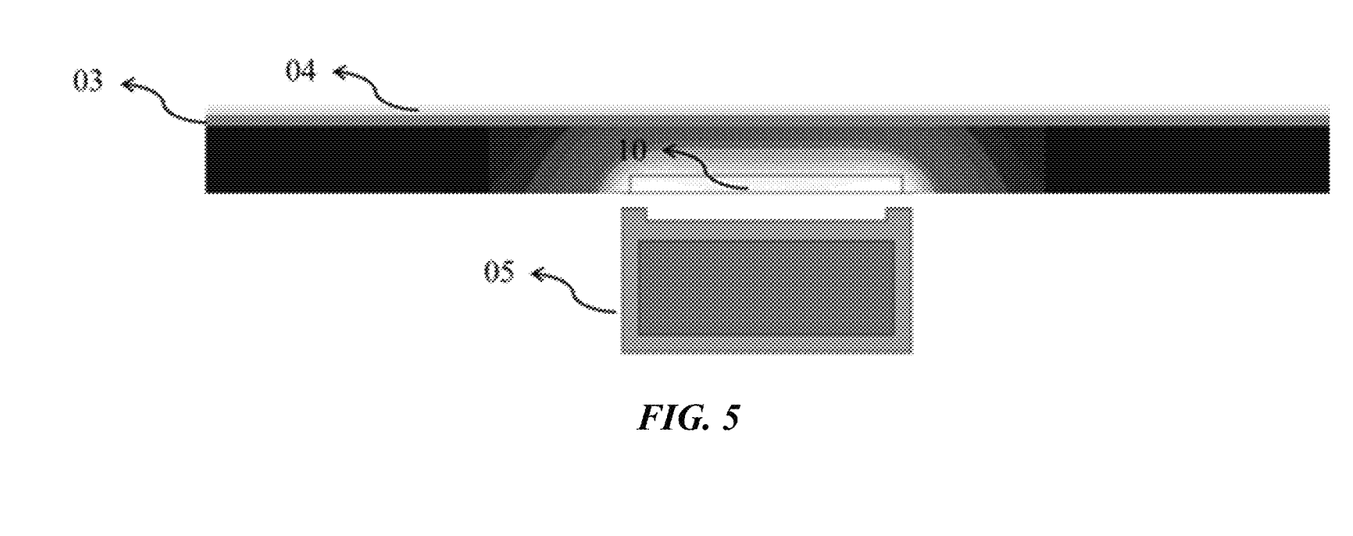
FIG. 5 is a side view of the system of FIG. 1 showing an example temperature profile.

The coupling of coil 05 with substrate 02 effect induces eddy currents within substrate 02 that generate heat via joule heating. The joule heating generated within inductively active substrate 02 then transfers heat to semiconductor film 04 atop it via thermal conduction. FIG. 5 shows this heat transfer by a heat profile 10 dissipating heat up to the deposited films 03, 04. Such induced heating of semiconductor film 04 may cause a crystallization of semiconductor film 04. For the induction heating process to effectively crystallize the semiconductor film, substrate 02 must be capable of withstanding temperatures higher than the melting point of semiconductor film 04, or alternatively, higher than the annealing temperature if a process increases the crystallinity of semiconductor film 04 in the solid state and not a liquid state as described above.

Inductively active substrate 02 must also be capable of absorbing enough magnetic energy such that sufficient joule heating can heat the substrate to the necessary temperature. Substrate characteristics such as geometrical shape, dimension, and composition are important considerations to account for when attempting to satisfy this heating requirement. Characteristics of the substrate are only partially responsible for the attainment of proper heat generation. Other important considerations include the induction coil geometry, current and frequency. A few examples of substrates that meet the compositional requirement include Stainless Steel, Tantalum, Molybdenum, and Graphite. Examples of materials capable of crystallization from the melt by such as process include single compound semiconductors, such as Silicon and Germanium, or congruently melting, multi-compound semiconductors, such as Gallium Arsenide. Examples of materials capable of crystallization improvement from annealing in the solid state using induction heating include other semiconductors such as CIGS, GaN, SiC, GaP, CdS, CdTe, ZnO, ZnS, InP, AlN, AlP, among various others, as well as metals and insulators.

FIG. 1 shows an isometric view of a system, 01, which includes an electrically conductive substrate 02, interlayers 03, a semiconductor film 04, an induction coil 05, and the magnetic coupling effect 06. The entire system 01 can be enclosed within a vacuum chamber, or, all components except the induction coil can be enclosed within a vacuum chamber. Alternatively, system 01 may be located outside such a vacuum chamber. The interlayers 03 represent the collection of films deposited between the substrate and the semiconductor film, and can be comprised of buffer layers, diffusion barriers, thermal expansion mismatch layers, light reflection layers, metal current collectors, or transparent conducting oxides (TCO's). Alternatively, there may be no interlayers present. Induction coil, 05, can be of any geometry to create the desired magnetic coupling effect, 06. The induction coil, 05, can be positioned either above or below the substrate, or, inside, or outside the vacuum chamber.

Figure 2:
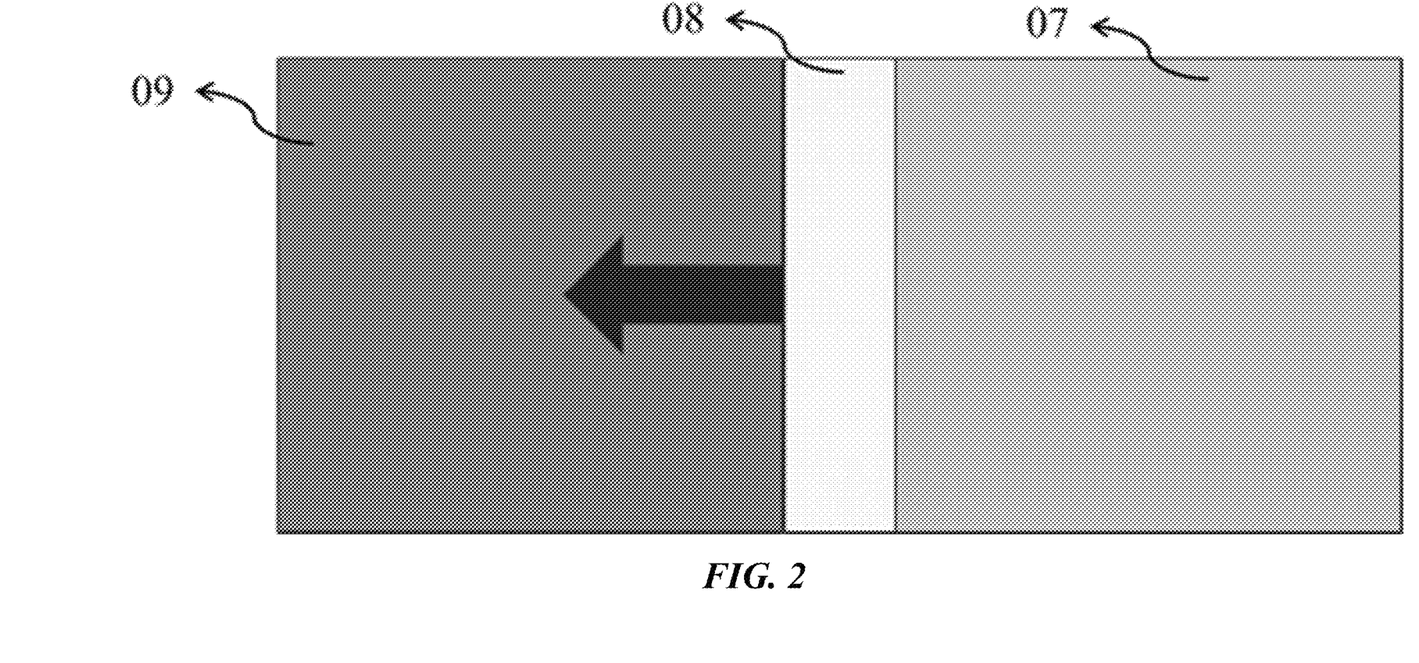
FIG. 2 is a top view of the semiconductor film of FIG. 1 in three material forms.

FIG. 2 shows a top down view of the semiconductor film in three material forms: crystallized, 07, molten, 08, and amorphous/nanocrystalline/polycrystalline, 09. The molten region, 08, travels from right to left in the figure, crystallizing the amorphous semiconductor material as it passes. The molten zone is created from the heating effects that arise from the coupling between the substrate and the energized induction coil.

Figure 3:
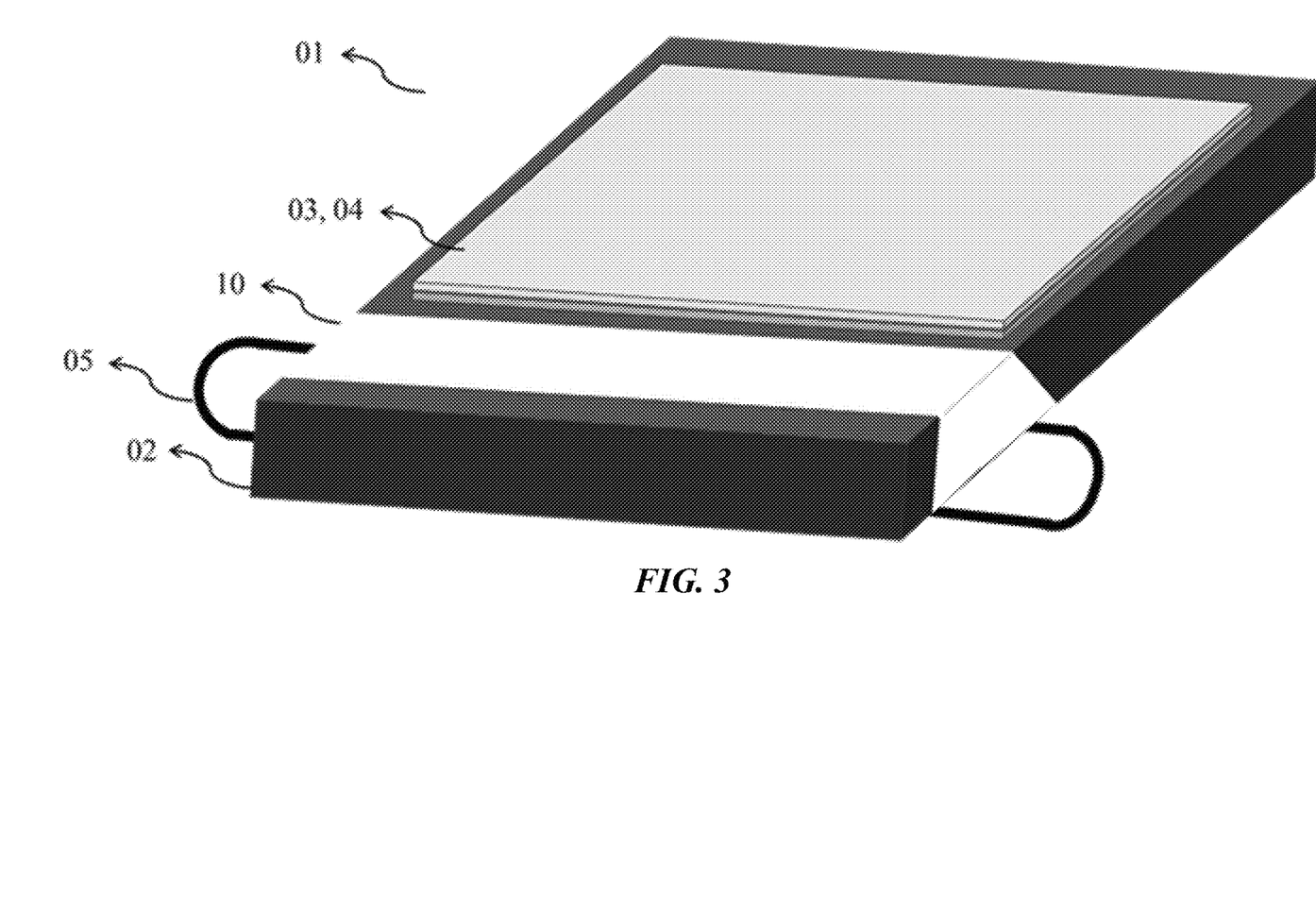
FIG. 3 is a perspective view of the system of FIG. 1, at a time after the coil is energized but before a scanning process begins.

FIG. 3 shows an isometric view of the system, 01, at a time after the coil is energized but before the scanning process begins. The scanning process is due to the relative motion between the substrate and the induction coil. During scanning, the coil can move along the length or width of the fixed substrate, or, the substrate can be moved along its length or width over or under the fixed coil. A combination of these motions may also occur. The heat profile, 10, that arises from the coupling between the substrate, 02, and the energized induction coil, 05, is shown. The interlayers and semiconductor film are labeled as a group, 03 and 04, respectively. Additionally, the interlayers and semiconductor films can be either deposited over the entirety of the substrate, or, as shown above, inwards of all substrate edges. The latter approach aids in the avoidance of lateral temperature variation in the deposited films that arise from edge effects. Alternatively, the induction coil can be designed such that it does not heat the edges of the substrate as intensely as it does the center of the substrate. The perimeter also allows for handling of the substrate without contacting the semiconductor film. The interlayers and semiconductor films can also be deposited onto the substrate through a mask to create a specific film pattern. One example would be for incorporation of a crystal seeding mechanism as described further below.

Figure 4:
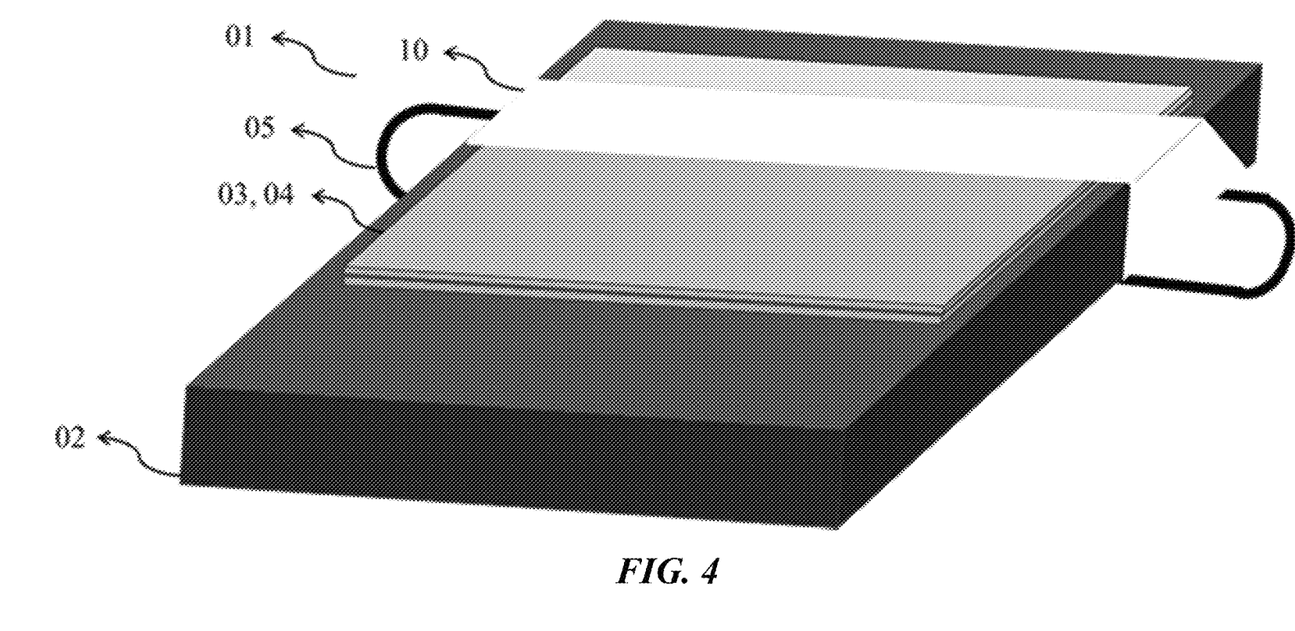
FIG. 4 is a perspective view of the system of FIG. 3 after the induction coil is energized and the scanning process has proceeded.

FIG. 4 shows an isometric view of the same system, 01, as in FIG. 3, after the induction coil is energized and the scanning process has proceeded. The area of the semiconductor film that has already received heat due to the scanning of the energized induction coil is represented in a darker shade of gray, indicating its change from amorphous to crystalline material.

FIG. 5 shows an example temperature profile, with shallower temperature gradients relative to those produced by lasers and electron beams, which is generated within an inductively coupled substrate. Heat produced within the substrate is thermally conducted into the deposited films (03, 04), such that it raises the semiconductor above its melting point, or above a critical temperature to allow a change in the semiconductor's material characteristics, which would include increasing its crystallinity in the solid state. Alternatively, one of the interlayers, 03, can be comprised of an inductively active thin film which couples to the induction coil and generates the heat, as opposed to the substrate. The heat is then transferred to the semiconductor film 04 to increase its crystallinity. Additionally, since the solubility of most impurities is higher in the liquid phase than it is in the solid phase, the energized indication coil, 05, can be scanned multiple times for zone refining of the semiconductor film.

Figure 6:
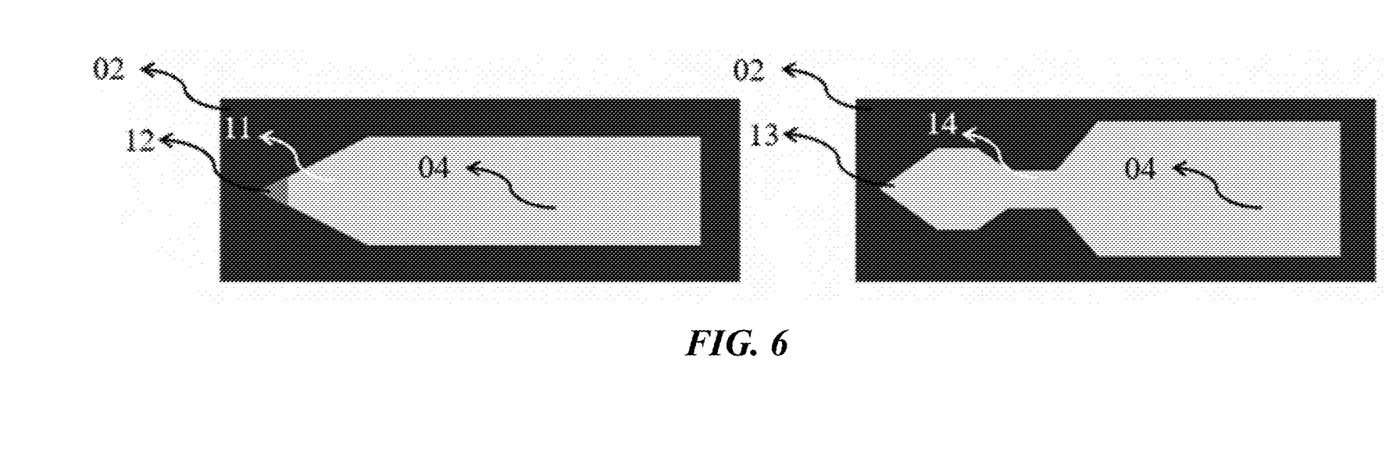
FIG. 6 depicts side views of seeding and necking processes for controlling a nucleation process to increase the crystal quality of the semiconductor film of FIG. 1.

FIG. 6 shows two distinct techniques for controlling the nucleation process to increase the crystal quality of the semiconductor film, 04. The two techniques are termed seeding and necking. The left depiction shows the seeding technique, where the semiconductor film is deposited through a mask or other means to produce a specific shape, 11, where a seed crystal, 12, is used to propagate growth from a selected crystal orientation. Alternatively, instead of the use of a seed crystal 12, randomly nucleated crystals can be made to propagate from the tip of 11 (where the seed crystal 12 would normally be) to produce a crystalline semiconductor film. Introducing a pre-formed crystal introduces an energetically favorable orientation for the intermolecular crystallization compared to nucleating under a different orientation. On the right side is the necking technique, where again the semiconductor film 04 is deposited through a mask or other means to produce a specific shape, 13; however, in the necking technique randomly nucleated grains are exposed to a filtering process at the neck, 14, to ensure that only one orientation reaches the main semiconductor area 04. Alternatively, a seed crystal 12 can be introduced at the tip of 13 and be made to propagate through the neck 14 to produce a crystalline semiconductor film.

In another example, a process for this film crystallization is the same as that described above except that a thin film is used instead of an inductively active substrate to generate heat. In this embodiment, it is the inductively active thin film that couples to the induction coil to provide heat generation. Thin films that are capable of providing such an effect include ferromagnetic materials such as cobalt, iron and nickel since they have high magnetic permeability. The high magnetic permeability of the ferromagnetic materials translates to a small skin depth. The skin depth, $\delta$, for a good electrical conductor is given approximately by $\delta = 1/\sqrt{\pi \mu f}$, where $\sigma$ is the electrical conductivity, $\mu$ is the magnetic permeability, and f is the chosen frequency. In this scenario, the inductively active thin film is deposited onto a substrate 02, as shown in FIG. 1 as one of the interlayers 03. Then, similar to that described above, a semiconductor film 04 is deposited either directly onto an inductively active thin film 03 or onto other interlayers 03, which themselves are deposited onto an inductively active thin film 03, whereby an induction coil 05 is used to generate an alternating magnetic field 06 that couples to the inductively active thin film. The coupling effect induces eddy currents within the thin film 03 that generate heat via joule heating. The joule heating generated within the inductively active thin film then transfers heat to the semiconductor film atop it via thermal conduction. FIG. 5 depicts this heating by the heat profile 10 dissipating heat up to the deposited films 03, 04. In this scenario, the figure shows the inductively active thin film as being grouped into the other interlayers, 03. Therefore, for the induction heating process to effectively crystallize the semiconductor film, the substrate must be capable of withstanding temperatures higher than the melting point of the semiconductor, or alternatively, higher than the annealing temperature when increasing the crystallinity of semiconductor in the solid state. The inductively active thin film 02 must also be capable of absorbing enough magnetic energy such that sufficient joule heating can heat the thin film 03 to the necessary temperature. Thin film 03 characteristics such as geometrical shape, dimension, and composition are important considerations to account for when attempting to satisfy this heating requirement. Characteristics of thin film 03 are only partially responsible for the attainment of proper heat generation. Other important considerations include the induction coil geometry, current and frequency.

In another example, amorphous, nanocrystalline, polycrystalline or combination thereof thin film of semiconductor material is zone heated in the solid state to a temperature above the melting point of the semiconducting material, at which point the film is converted to a molten liquid, as shown in FIG. 2. As the heat zone progresses past the initial zone-heated section, cooling of the solidification front occurs such that the temperature of the molten semiconductor 08 on that front descends below the melting point, thereby solidifying the molten semiconductor into a polycrystalline or single crystalline semiconductor material 07. The translational heating required for this process is provided by a moving line of heat generated from the coupling effects 06 of the substrate with an induction coil from relative motion between the two.

Alternatively, in another example, an amorphous, nanocrystalline, polycrystalline or combination thereof thin film of semiconductor material is zone heated in the solid state to a temperature that is conducive to increasing the crystallinity of the as deposited film. This temperature can be below the semiconductor's melting temperature. The translational heating required for said process is provided by a moving line of heat generated from the coupling effects 06 of the substrate with an induction coil from relative motion between the two.

In another example illustrated in FIG. 2, the heated semiconductor region 08 that is induced from the heat generated from the induction coupling effects 06 with the inductively active substrate or thin film can be translated from one region to another, crystallizing the amorphous, nanocrystalline, polycrystalline or combination thereof semiconductor material as it passes. As depicted in FIG. 3, the scanning action can be achieved by controlling a relative motion between the substrate or thin film and the induction coil.

In another example the propagative crystal growth process described above is extended. All methods of crystal growth from the melt rely on cooling the molten semiconductor below its freezing point. Typically, this process produces a polycrystalline material. However, if proper care is exercised, a single crystal orientation can be made to propagate preferentially, thereby increasing the crystal quality of a semiconductor film. Furthermore, this type of crystal orientation propagation can occur in the solid state, such as that described above, as well. To achieve this type of crystal growth, the process must proceed from an initial nucleation site 12 or 13. FIG. 6 shows two examples for controlling the nucleation process that provide a crystallographic face in which growth can be propagated from to increase the crystal quality of the semiconductor film, 04. Herein, the two techniques are termed "seeding" and "necking". The left depiction shows the seeding technique, where the semiconductor film is deposited through a mask or other means to produce a specific shape, 11, where a seed crystal, 12, is used to propagate growth from a selected crystal orientation. Introducing a pre-formed crystal introduces an energetically favorable orientation for the intermolecular crystallization compared to nucleating under a different orientation. On the right side is the necking technique, where again the semiconductor film 04 is deposited through a mask or other means to produce a specific shape, 13, however, in the necking technique randomly nucleated grains are exposed to a filtering process at the neck, 14, to ensure that only one orientation reaches the main semiconductor area 04. Both depictions follow continuous lateral crystal growth, whereby the growth front is seeded by the preceding crystallized region, forming high quality, long parallel grains. Predetermination of crystal orientation by seeding is a common approach in the fabrication of bulk crystal growth and is applied in this process for thin films.

In another example, the deposition technique used for the semiconductor film 04 is electron beam evaporation. However, other deposition techniques such as physical vapor deposition (PVD), sputtering, thermal evaporation, electroplating, chemical vapor deposition (CVD), plasma enhanced chemical vapor deposition (PECVD), metal organic chemical vapor deposition (MOCVD), hydride vapor phase epitaxy (HVPE), pulsed laser deposition (PLD), atomic layer deposition (ALD) or chemical solution deposition can be used. These deposition techniques can also be used for the deposition of the interlayers 03. The interlayers 03 represent the collection of films deposited between the substrate and the semiconductor film, and can be comprised of buffer layers, diffusion barriers, thermal expansion mismatch layers, light reflection layers, metal current collectors, transparent conducting oxides, or inductively active thin films. Both the semiconductor and interlayer films can have varying thicknesses. In one embodiment, the semiconductor thickness ranges from 10 nanometers up to 100 microns. Each individual interlayer thickness can range from 10 nanometers to 10 microns.

In an example, the induction heating crystallization process can be used to not only increase the crystallinity of the deposited semiconductor film, but also to activate dopants within the film. For example, high temperatures are often required for the activation of dopants within wide bandgap semiconductors, such as GaN and SiC. In this example, the heat generated within the substrate or inductively active thin film would allow both the crystallinity of the semiconductor film to be improved while also activating dopant atoms required for proper electronic functionally of the semiconductor film.

The above-described system and methods increase the crystallinity of thin films deposited on a substrate relative to the prior art. The technology is applicable to a wide range of materials and is capable of producing large area, lightweight, flexible crystalline thin films using roll-to-roll manufacturing practices.

The described thin film crystallization process may be employed to grow, or increase the crystallinity of, semiconductor materials in thin film form. Examples include high efficiency photovoltaic (PV) semiconductors that cannot otherwise be economically grown through conventional methods. The process can also be utilized to grow, or increase the crystallinity of, wide band gap thin film semiconductors for use in a range of applications including LEDs, flexible and power electronics, laser diodes, etc. Ultimately, the technology allows for the fabrication of crystalline semiconductors in thin film form that can be used for a variety of applications, but most notably for electronic devices. The process significantly reduces the cost and increases the performance of thin film crystalline semiconductors, and thus, opens up a range of new applications for thin film, lightweight, or flexible electronics.

The semiconductor thin films produced by the above described systems and methods may be used as alternative substrates to crystal semiconductor wafers, or, as novel substrates to enable new electronic applications. The substrates can be used for a wide variety of electronic applications, some of which may include photovoltaics, light emitting diodes, thin film transistors, sensors, power electronics, optical devices, and laser diodes.

The innovative semiconductor growth process outlined herein serves as a platform technology for manufacturing high quality, large area, semiconductor thin films that can be used in a variety of energy applications. Any application that requires the use of crystalline semiconductor wafers to produce electrical devices can utilize semiconductor films produced by the disclosed technology. A few examples of such applications include photovoltaics, light emitting diodes, and power electronics. The high quality, large area, semiconductor thin films that can be produced by the disclosed technology can be used as an alternative to expensive bulk wafers that are currently required in these applications. Using substrates produced by the disclosed technology would decrease device manufacturing costs by eliminating the need for costly wafers, increasing throughput by using larger area substrates, and permit the use of roll to roll manufacturing. The substrate may also open up markets that prefer a lightweight, flexible solution. As an example, with respect to the solar industry the disclosed technology could produce high efficiency thin film solar modules at a significantly lower cost than incumbent technologies. The thin film crystallization process eliminates the requirements for expensive semiconductor wafers to be used as standalone cells, or as host substrates for epitaxial growth and lift off. The process allows for roll-to-roll manufacturing techniques to be used, which is a stark contrast to the highly complex manufacturing process and expensive industrial equipment currently required. It is the combination of the process's ability to produce high efficiency materials using high throughput equipment that allow for a significant overall cost reduction to be attained.

Figure 8:
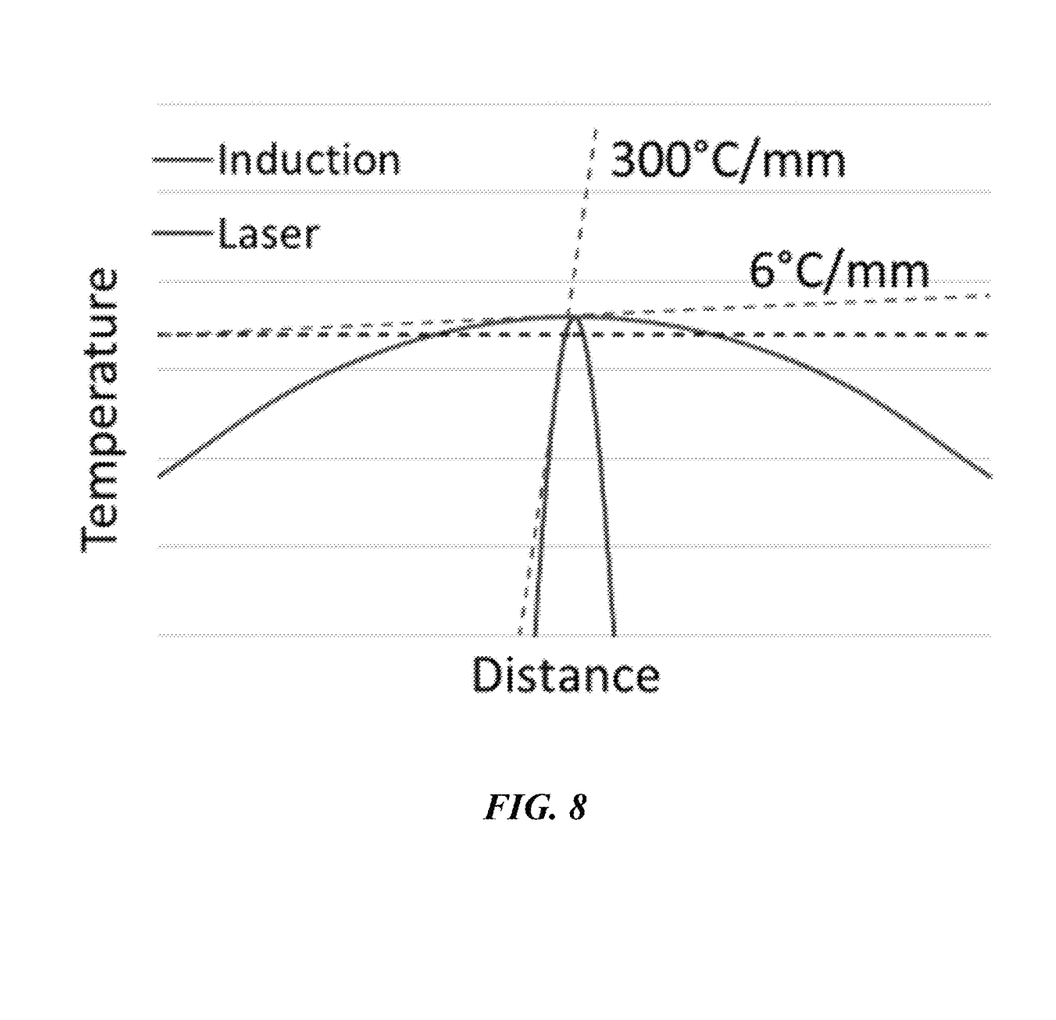
FIG. 8 is a graph of temperature versus distance for induction and laser heating.

The substrates described above deliver many desired characteristic of a flexible semiconductor platform (see e.g., FIG. 7). Advantageously, the process allows a substrate wide melt zone to be created that allows for single pass recrystallization, making it ideal as an in-line tool for high throughput roll-to-roll (R2R) manufacturing. This is impractical for laser systems, which require complex raster scanning and beam shaping optics. Additionally, induction heating generates much shallower temperature gradients than lasers (see FIG. 8 where induction heating is shown by the top arc and laser heating by the bottom narrower arc), a vital condition for high quality crystal growth. Unlike lasers, where the abrupt beam defines the temperature profile, the proposed process provides the capability to engineer temperature profiles through the controlled generation of eddy currents using precision designed coils, resulting in far superior recrystallization conditions. Furthermore, the substrate is high temperature compatible and suitable for existing CMOS processing, a significant advantage over existing flexible substrates that impose severe challenges on device manufacturers to re-engineer standard fabrication processes to accommodate lower thermal budgets. The described systems and methods may allow a transition of valuable semiconductors from fabs to flexible electronics for the first time, offering an entirely new platform for device manufacturers. Such transition may catalyze the evolution from small scale, wafer-based batch processing, to high throughout R2R processing that incorporates thin film printing capabilities and ultimately disrupting the semiconductor and device manufacturing industries.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method for forming a crystalline semiconductor film, the method comprising:
    applying a first semiconductor thin film onto a supporting electrically conductive substrate;
    electrically coupling to the supporting electrically conductive substrate through a coil positioned adjacent to the supporting electrically conductive substrate;
    creating a heat zone along a width of the supporting electrically conductive substrate which conducts to a corresponding zone of the first semiconductor thin film to melt the corresponding zone of the first semiconductor thin film;
    scanning the heat zone along a length of the supporting electrically conductive substrate through relative motion between the supporting electrically conductive substrate and the coil to melt corresponding zones of the first semiconductor thin film; and
    controlling the melted first semiconductor thin film zones to solidify into a crystalline film as the heat zone progresses past the zone-heated region.

2. The method of claim 1, further comprising positioning the supporting electrically conductive substrate in a vacuum chamber.

3. The method of claim 1, further comprising applying a buffer layer between the supporting electrically conductive substrate and the first semiconductor thin film.

4. The method of claim 1, further comprising applying a diffusion barrier between the supporting electrically conductive substrate and the first semiconductor thin film.

5. The method of claim 1, further comprising applying a thermal expansion matching layer between the supporting electrically conductive substrate and the first semiconductor thin film.

6. The method of claim 1, wherein energizing the coil comprises controlling the frequency of a current provided to the coil.

7. The method of claim 1, wherein the first semiconductor thin film has a thickness of less than 100 microns.

8. The method of claim 1, wherein the supporting electrically conductive substrate has a thickness of less than 1 centimeter.

9. The method of claim 1, wherein the supporting electrically conductive substrate consists of any one of the following materials or their alloys: C, Ta, Ti, Mo, W, Co, Cu, Ni, MoLa, MHC, TZM, MoRe and stainless steel.

10. The method of claim 1, wherein the semiconductor consists of any one of the following elements or compounds: Si, Ge, GaAs.

11. The method of claim 1, wherein the applying the first semiconductor thin film comprises depositing in such a way as to form a triangular or necking starting point to control primary nucleation.

12. The method of claim 1, further comprising adding a seed crystal to the supporting electrically conductive substrate that makes physical contact with a starting point of the first semiconductor thin film.

13. The method of claim 1, further comprising depositing an encapsulation layer atop the semiconductor film.

14. The method of claim 1, further comprising scanning the energized coil along the supporting electrically conductive substrate to provide zone heating from one end of the supporting electrically conductive substrate to the other.

15. The method of claim 1, further comprising scanning the supporting electrically conductive substrate above or below the fixed energized coil as to provide zone heating from one end of the supporting electrically conductive substrate to the other.

16. The method of claim 1, further comprising annealing the substrate after the changing the property.

17. The method of claim 1, wherein motion of the energized coil relative to the substrate causes zone heating such that zone refining of the semiconductor film occurs.

18. The method of claim 1, wherein the changing the property comprises increasing a crystallization of the semiconductor film.

19. A method of forming a crystalline semiconductor film, the method comprising:
    applying a first semiconductor thin film onto a supporting electrically conductive substrate;
    electrically coupling to the supporting electrically conductive substrate through a coil positioned adjacent to the supporting electrically conductive substrate;
    creating a heat zone to a temperature above 1200 degrees C. along a width of the supporting electrically conductive substrate which conducts to a corresponding zone of the first semiconductor thin film to activate dopants within the zone of the semiconductor film;
    scanning the heat zone along a length of the supporting electrically conductive substrate through relative motion between the supporting electrically conductive substrate and the coil to activate dopants within the corresponding zones of the first semiconductor thin film; and
    controlling cooling of the first semiconductor thin film zones to solidify into a crystalline film as the heat zone progresses past the zone-heated region.

* * * * *